United States Patent
Tanaka

(10) Patent No.: US 9,136,438 B2
(45) Date of Patent: Sep. 15, 2015

(54) SEMICONDUCTOR LIGHT-EMITTING ELEMENT

(71) Applicant: STANLEY ELECTRIC CO., LTD., Meguro-ku, Tokyo (JP)

(72) Inventor: Satoshi Tanaka, Machida (JP)

(73) Assignee: STANLEY ELECTRIC CO., LTD., Tokyo (JP)

( * ) Notice: Subject to any disclaimer, the term of this patent is extended or adjusted under 35 U.S.C. 154(b) by 0 days.

(21) Appl. No.: 14/487,819

(22) Filed: Sep. 16, 2014

(65) Prior Publication Data

US 2015/0084082 A1    Mar. 26, 2015

(30) Foreign Application Priority Data

Sep. 24, 2013  (JP) ................... 2013-196723

(51) Int. Cl.
*H01L 33/00* (2010.01)
*H01L 33/40* (2010.01)

(52) U.S. Cl.
CPC ..................... *H01L 33/405* (2013.01)

(58) Field of Classification Search
CPC ....... H01L 33/44; H01L 33/405; H01L 33/20; H01L 33/145; H01L 33/38; H01L 33/387; H01L 33/42
USPC .......................................... 257/98
See application file for complete search history.

(56) References Cited

U.S. PATENT DOCUMENTS

| | | | |
|---|---|---|---|
| 2006/0273335 A1* | 12/2006 | Asahara et al. | 257/98 |
| 2012/0049232 A1* | 3/2012 | Okabe et al. | 257/98 |
| 2012/0235204 A1* | 9/2012 | Hodota et al. | 257/98 |
| 2013/0146909 A1* | 6/2013 | Kojima et al. | 257/98 |

FOREIGN PATENT DOCUMENTS

| | | |
|---|---|---|
| JP | 2006041403 A | 2/2006 |
| JP | 2007027539 A | 2/2007 |

* cited by examiner

*Primary Examiner* — Trung Q Dang
(74) *Attorney, Agent, or Firm* — Holtz, Holtz, Goodman & Chick PC

(57) ABSTRACT

A semiconductor light-emitting element includes: an ohmic electrode layer formed on a surface of a semiconductor structure layer including a light-emitting layer; a reflective metal layer containing Ag formed so as to cover at least ends of the ohmic electrode layer; and a covering electrode layer formed so as to bury the reflective metal layer.

6 Claims, 4 Drawing Sheets

SEMICONDUCTOR LIGHT-EMITTING ELEMENT

BACKGROUND OF THE INVENTION

1. Field of the Invention

The present invention relates to a semiconductor light-emitting element such as a light-emitting diode (LED).

2. Background Art

A semiconductor light-emitting element such as a light-emitting diode is manufactured typically by growing an n-type semiconductor layer, a light-emitting layer, and a p-type semiconductor layer on a growth substrate and forming an n-electrode and a p-electrode for applying a voltage to the n-type semiconductor layer and the p-type semiconductor layer, respectively.

As a semiconductor light-emitting element for improving its light extraction efficiency in the above-described structure, a semiconductor light-emitting element having a structure in which a reflective metal layer made of a highly-reflective metal is formed on the p-type semiconductor layer and the p-electrode is formed on the reflective metal layer is currently known.

Japanese Patent Application Laid-Open No. 2006-41403 discloses a semiconductor light-emitting element having a structure in which a p-electrode made of a metal layer including an Ag layer is formed on a p-type semiconductor layer and an insulating protection film is formed so as to surround the p-electrode. Japanese Patent Application Laid-Open No. 2007-27539 discloses a semiconductor light-emitting element having a structure in which a contact layer and a reflective electrode are layered on a p-type semiconductor layer in order and a p-electrode is provided so as to cover the reflective electrode.

SUMMARY OF THE INVENTION

As described above, if the light-reflecting metal is formed on the p-type semiconductor layer, for example, light from the light-emitting layer can be extracted efficiently from a surface of the n-type semiconductor layer, for example. An example of the reflective metal layer may be made of Ag, which is a metal having a high light reflectivity, or an alloy containing Ag. However, Ag is known for its easy migration to another layer. Such Ag migration results in a significant adverse effect on the reliability of the element such as degradation in electric properties in the element.

The present invention has been made in view of the above circumstances and an object thereof is to provide a semiconductor light-emitting element capable of preventing migration and thereby achieving high reliability as well as having high light extraction efficiency.

A semiconductor light-emitting element according to the present invention includes: an ohmic electrode layer formed on a surface of a semiconductor structure layer including a light-emitting layer; a reflective metal layer containing Ag formed so as to cover at least ends of the ohmic electrode layer; and a covering electrode layer formed so as to bury the reflective metal layer.

DETAILED DESCRIPTION OF THE INVENTION

Figure 1A:
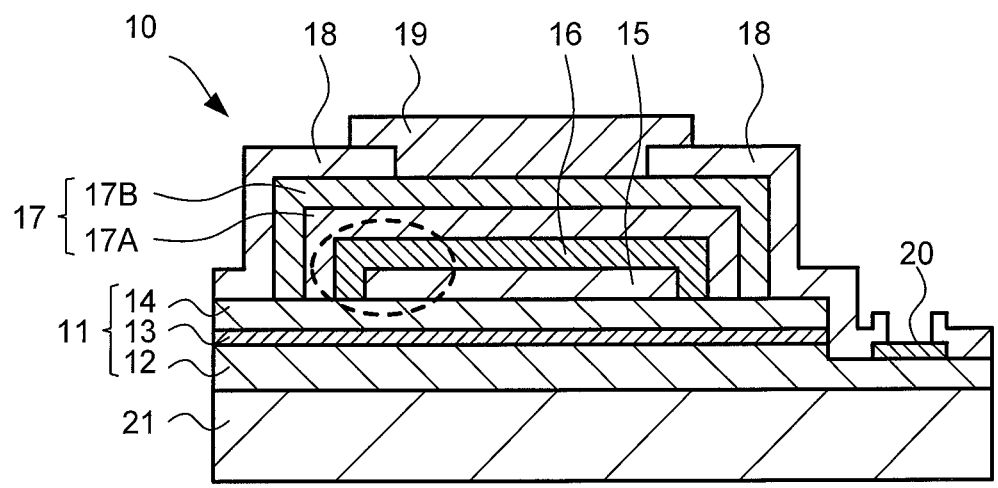
FIGS. 1A and 1B are cross-sectional views illustrating a structure of a semiconductor light-emitting element according to a first embodiment.

A semiconductor light-emitting element according to the present invention has a structure in which a reflective metal layer containing Ag is reliably covered by a conductive oxide film. Preferred embodiments of the present invention will be described below in detail. Note that substantially the same or equivalent elements will be denoted by the same reference numeral in the following description and the accompanying drawings.

First Embodiment

Figure 1B:
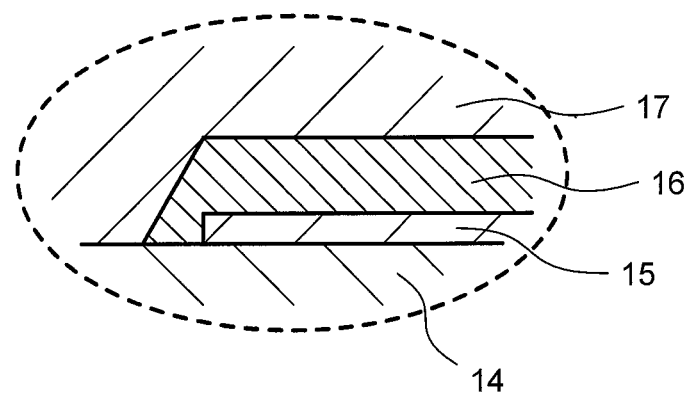

FIG. 1A is a cross-sectional view illustrating a structure of a semiconductor light-emitting element 10 according to the first embodiment of the present invention. FIG. 1B is a partially-enlarged cross-sectional view illustrating a portion of FIG. 1A in an enlarged manner. As shown in FIG. 1A, the semiconductor light-emitting element 10 has a semiconductor structure layer 11 including a light-emitting layer 13. The semiconductor structure layer 11 has a structure in which an n-type semiconductor layer (first semiconductor layer) 12 having a composition of $Al_xIn_yGa_{1-x-y}N$ ($0 \leq x \leq 1$ and $0 \leq y \leq 1$), the light-emitting layer 13, and a p-type semiconductor layer (second semiconductor layer) 14 are grown on a growth substrate 21 in order. The semiconductor structure layer 11 has a structure in which the n-type semiconductor layer 12 and the p-type semiconductor layer 14 having a conductivity type opposite to the n-type are provided so as to interpose the light-emitting layer 13 therebetween.

An ohmic electrode layer 15 is formed as a p-electrode on the p-type semiconductor layer 14. The ohmic electrode layer 15 is made of an oxide film having light-transmitting and conductive properties. Examples of the material of the ohmic electrode layer 15 may include ITO, IZO, ZnO, etc. A reflective metal layer 16 is formed on the ohmic electrode layer 15 so as to cover the entire ohmic electrode layer 15. The reflective metal layer 16 is made of an Ag layer, a layer made of an alloy containing Ag, or a metal layer having a multi-layered structure including these layers.

A covering electrode layer 17 for burying the reflective metal layer 16 is provided on the reflective metal layer 16. The covering electrode layer 17 includes: a first covering electrode layer 17A provided so as to bury the reflective metal layer 16; and a second covering electrode layer 17B provided so as to cover the first covering electrode layer 17A. The first covering electrode layer 17A and the second covering electrode layer 17B each are made of a conductive oxide film. Examples of the material of the first covering electrode layer 17A and the second covering electrode layer 17B may include ITO, IZO, ZnO, etc. Moreover, the first covering electrode layer 17A has an oxygen concentration smaller than that of the second covering electrode layer 17B.

An insulating layer 18 is provided on the covering electrode layer 17 so as to cover the covering electrode layer 17. The insulating layer 18 is made of an insulating oxide film or nitride film, e.g., $SiO_2$ or SiN. The insulating layer 18 is provided with an aperture. In the aperture, a pad electrode 19 connected to the covering electrode layer 17 is provided. Moreover, an n-electrode 20 is provided on the n-type semiconductor layer 12.

Figure 2:
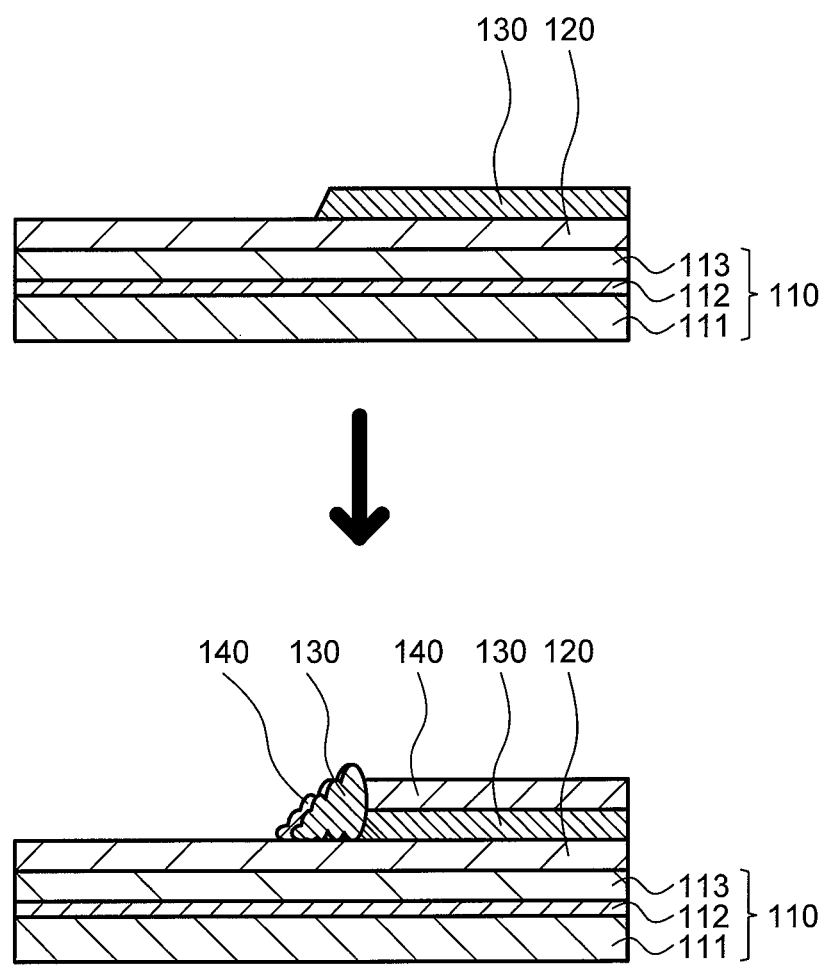
FIG. 2 is a diagram for explaining a problem to be solved by the present invention.

Referring to FIG. 2, a manufacturing-related problem to be the cause of Ag electromigration which occurs during an operation of the element will now be described. FIG. 2 is a cross-sectional view schematically illustrating a case where an ohmic electrode 120 is formed on a p-type semiconductor layer 113 and a reflective metal layer 130 containing Ag is formed thereon in a semiconductor structure layer 110 comprising an n-type semiconductor layer 111, a light-emitting layer 112, and the p-type semiconductor layer 113. As an example for the prevention of Ag migration, the reflective metal layer 130 containing Ag may be covered by an insulating layer 140 such as $SiO_2$, for example. Here, it is preferable that the high-density insulating layer 140 without a film defect be formed in order to reliably cover Ag. A film formation temperature of the insulating layer 140 is kept high.

The inventor of the present application focused on a fact that the formation of the insulating layer 140 at a high temperature causes Ag at an end of the reflective metal layer 130 to protrude and thereby have irregularities in its shape. If Ag protrudes, a covering defect or crack occurs in the insulating layer 140. Note that as the layer thickness of the reflective metal layer 130 containing Ag at the end thereof gets smaller, Ag is more likely to protrude. Due to the formation of the insulating layer 140, a portion where the reflective metal layer 130 is exposed from the surface of the insulating layer 140 is formed or the insulating layer 140 has a portion with a smaller layer thickness especially at the end of the reflective metal layer 130. The inventor of the present application attained a finding that the covering defect of the insulating layer 140 due to such Ag protrusion causes electromigration and thereby leads to degradation in the reliability of the element.

Next, the ohmic electrode layer 15, the reflective metal layer 16, and the covering electrode layer 17 of the semiconductor light-emitting element 10 according to the present embodiment will be described in more detail. Here, a case where: the ohmic electrode layer 15 is made of an ITO layer; the reflective metal layer 16 is made of an Ag layer; the covering electrode layer 17, i.e., the first and second covering electrode layers 17A and 17B, is made of an ITO layer; and the insulating layer 18 is made of an $SiO_2$ layer.

Referring back to FIG. 1A, the covering electrode layer 17 will now be described. As compared with $SiO_2$, ITO can be formed at a lower temperature. Therefore, forming the covering electrode layer (ITO layer) 17 on the reflective metal layer (Ag layer) 16 can reduce the risk of causing Ag in the reflective metal layer 16 to protrude. Thus, the reflective metal layer 16 can be reliably covered. Furthermore, even when a high-temperature state is maintained during the formation of the insulating layer ($SiO_2$ layer) 18, the insulating layer 18 can have a constant layer thickness since the reflective metal layer 16 has already been covered reliably by the covering electrode layer 17. Thus, a high protective performance and a high insulating property can be obtained.

As described above, the first covering electrode layer 17A has an oxygen concentration smaller than that of the second covering electrode layer 17B. Here, the first covering electrode layer 17A is referred to as a low-oxygen ITO layer and the second covering electrode layer 17B is referred to as a high-oxygen ITO layer. First, the low-oxygen ITO layer 17A is provided so as to bury the reflective metal layer 16. Since the low-oxygen ITO layer 17A has a smaller oxygen concentration, the low-oxygen ITO layer 17A has characteristics closer to a metal, thereby improving its adhesion with the reflective metal layer 16. Note that if the first covering electrode layer 17A is made of ITO having a high oxygen concentration, its adhesion with the reflective metal layer 16 is reduced, thereby degrading the covering quality thereof. Furthermore, Ag in the reflective metal layer 16 is easily influenced by moisture or oxygen, resulting in the generation of silver hydroxide as a result of a chemical reaction. This silver hydroxide is unstable and easily turned into silver oxide to deposit Ag ions. This is the cause of the occurrence of the Ag migration. Thus, the generation of silver hydroxide can be suppressed by reducing the oxygen concentration in the first covering electrode layer 17A.

Furthermore, the high-oxygen ITO layer 17B formed so as to cover the low-oxygen ITO layer 17A has a higher oxygen concentration. Thus, an affinity with the insulating layer 18, which is also an oxide film, is enhanced, thereby making it possible to improve the adhesion between the high-oxygen ITO layer 17B and the insulating layer 18.

Next, with reference to FIG. 1B, the ohmic electrode layer 15 and the reflective metal layer 16 will be described. FIG. 1B is an enlarged view of the portion surrounded by a broken line in FIG. 1A. The reflective metal layer 16 is formed so as to cover the ohmic electrode layer 15. Thus, the ends of the reflective metal layer 16 are in contact with the p-type semiconductor layer 14. The adhesion between the reflective metal layer 16 and the p-type semiconductor layer 14 is stronger than the adhesion between the reflective metal layer 16 and the ohmic electrode layer 15. Therefore, due to the contact of the ends of the reflective metal layer 16 with the p-type semiconductor layer 14, the ends of the reflective metal layer 16 have a greater adhesion level than the other portions of the reflective metal layer 16 in contact with the ohmic electrode layer 15. Consequently, it is possible to prevent Ag from being protruded at the end of the reflective metal layer 16 by a subsequent thermal process or the like. Moreover, even if the end of the reflective metal layer 16 has a smaller thickness, the Ag protrusion can be suppressed.

As described above, the reflective metal layer 16 containing Ag is reliably covered by the ohmic electrode layer 15 and the covering electrode layer 17. Therefore, the semiconductor light-emitting element capable of preventing the occurrence of the Ag migration and having high reliability can be provided.

While the case where the covering electrode layer 17 is formed by the two layers of the low-oxygen ITO layer 17A and the high-oxygen ITO layer 17B has been described above, the covering electrode layer 17 may be formed such that the oxygen concentration thereof increases from the reflective metal layer 16 toward the insulating layer 18. For example, the covering electrode layer 17 can be manufactured by changing conditions for forming ITO, e.g., a formation temperature or an oxygen concentration to be supplied. It is only necessary that the ITO layer having a low oxygen concentration is formed in contact with the reflective metal layer 16 and the ITO layer having a high oxygen concentration is formed in contact with the insulating layer 18. For example, the covering electrode layer 17 may be formed by three or more ITO layers.

While the case where the reflective metal layer 16 is formed so as to cover the entire ohmic electrode layer 15 has been described above, it is only necessary that the reflective metal layer 16 is formed so as to cover at least the ends of the ohmic electrode layer 15. In other words, the ohmic electrode layer 15 may have a portion not covered by the reflective metal layer 16. Due to the covering of the ends of the ohmic electrode layer 15 by the reflective metal layer 16, a portion where the reflective metal layer 16 is in contact with the p-type semiconductor layer 14 is formed, thereby obtaining enhanced adhesion.

Note that the ohmic electrode layer 15 and the reflective metal layer 16 function as a light-reflecting layer. This light-reflecting layer reflects light emitted from the light-emitting layer 13 with high efficiency, thereby making it possible to extract a lot of light from a light extraction surface.

Note that the covering electrode layer 17 preferably has a sheet resistance lower than that of the ohmic electrode layer 15. If the covering electrode layer 17 has a lower sheet resistance, current is diffused in the covering electrode layer 17, thereby making it possible to homogenize the distribution of current supplied to the p-type semiconductor layer 14.

Moreover, the covering electrode layer 17 and the ohmic electrode layer 15 both form ohmic contact with the p-type semiconductor layer 14. Thus, current can be supplied to the p-type semiconductor layer 14 not only from the region where the ohmic electrode layer 15 is formed but also from the region of the covering electrode layer 17 in contact with the p-type semiconductor layer 14, thereby increasing the light-emitting region. Moreover, as viewed from the p-type semiconductor layer 14 side, the reflective metal layer 16 is interposed between the covering electrode layer 17 and the ohmic electrode layer 15. Thus, the rim portion of the light-emitting region formed by the reflective metal layer 16 becomes less visible due to the existence of the covering electrode layer 17 and the ohmic electrode layer 15, thereby homogenizing the in-plane emission intensity. Therefore, a high luminous efficiency and light emission uniformity can be achieved.

Second Embodiment

Figure 3A:
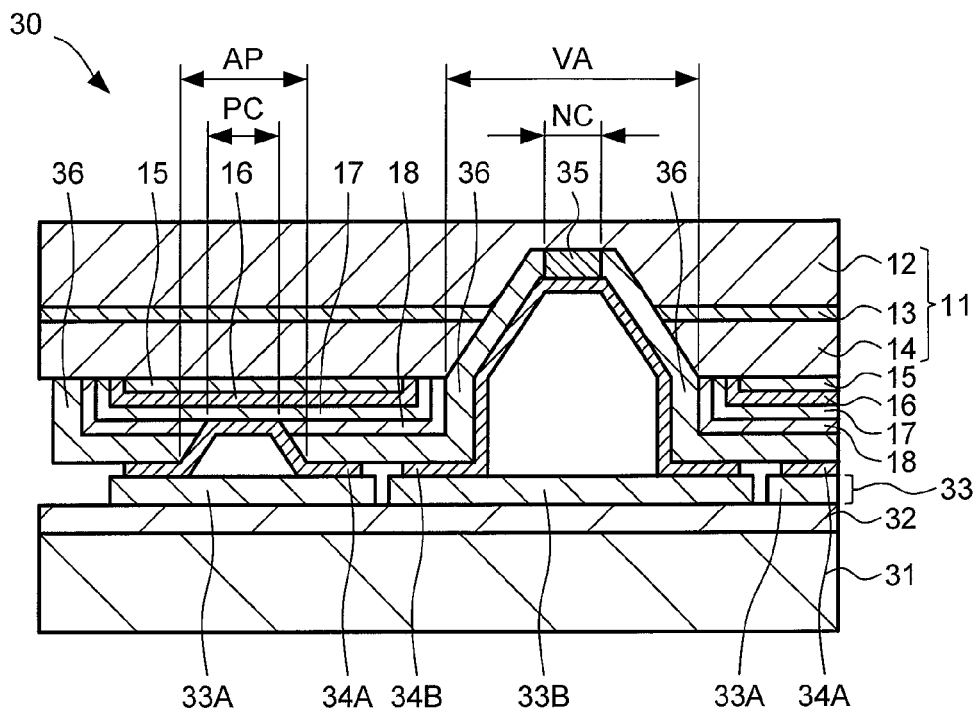
FIGS. 3A and 3B are views illustrating a structure of a semiconductor light-emitting element according to a second embodiment.
Figure 3B:
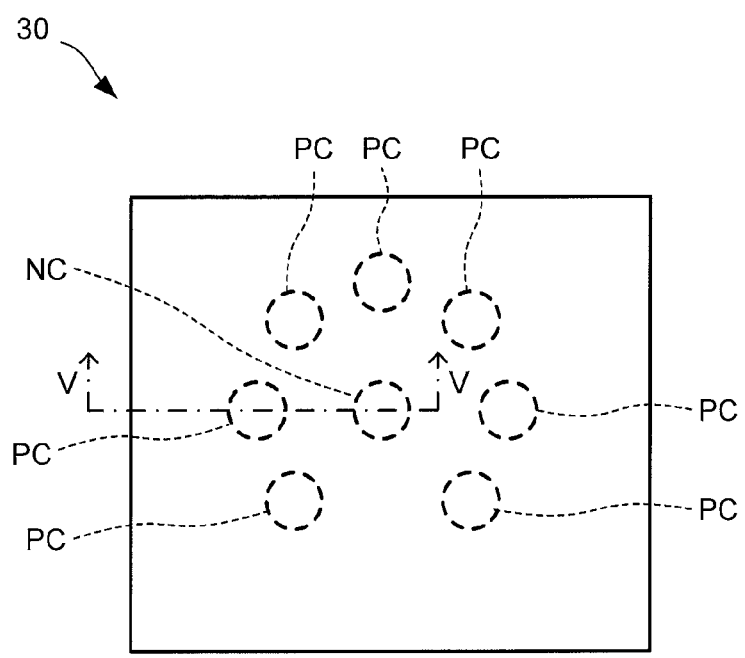

FIGS. 3A and 3B are a cross-sectional view and a plan view, respectively, illustrating a structure of a semiconductor light-emitting element 30 according to the second embodiment. More specifically, FIG. 3A is a cross-sectional view taken along the line V-V in FIG. 3B. As shown in FIG. 3A, the semiconductor light-emitting element 30 has the same structure as the semiconductor light-emitting element 10 of the first embodiment in that the ohmic electrode layer 15 as the p-electrode, the reflective metal layer 16, the covering electrode layer 17, and the insulating layer 18 are formed on the p-type semiconductor layer 14 of the semiconductor structure layer 11. The semiconductor light-emitting element 30 of the present embodiment has an n-electrode 35 formed in a through hole VA extending from the p-type semiconductor layer 14 side into the n-type semiconductor layer 12 through the p-type semiconductor layer 14 and the light-emitting layer 13 and connected to the n-type semiconductor layer 12. Moreover, the semiconductor light-emitting element 30 includes a p-side wiring 34A connected to the covering electrode layer 17 and an n-side wiring 34B connected to the n-electrode 35.

More specifically, an insulating protection film 36 is formed on the insulating layer 18 so as to cover the insulating layer 18. In a part of the semiconductor structure layer 11, the through hole (via) VA is provided so as to extend from the p-type semiconductor layer 14 side into the n-type semiconductor layer 12 through the p-type semiconductor layer 14 and the light-emitting layer 13. An inner surface of the through hole VA in the semiconductor structure layer 11 is covered by the insulating protection film 36. The through hole VA is provided with an aperture. The n-electrode 35 is provided in that aperture, thereby forming an n-side contact portion NC. Specifically, the n-electrode 35 is provided in the through hole VA, runs through the insulating protection film 36, and is connected to the n-type semiconductor layer 12. Moreover, the n-side wiring 34B is provided on the insulating protection film 36 and connected to the n-electrode 35 in the n-side contact portion NC. The p-side wiring 34A is provided on the insulating protection film 36, runs through the insulating protection film 36 and the insulating layer 18, and is connected to the covering electrode layer 17 in a p-side contact portion PC. Note that FIG. 3B is a top view of the semiconductor light-emitting element 30. For the ease of understanding, the p-side contact portion PC and the n-side contact portion NC are indicated by broken lines.

As shown in FIG. 3A, the semiconductor light-emitting element 30 is supported by a support substrate 31. A support substrate-side insulating layer 32 is provided on the surface of the support substrate 31. A joining layer 33 is provided on the surface of the support substrate-side insulating layer 32. The joining layer 33 includes a p-side joining layer 33A connected to the p-side wiring 34A and an n-side joining layer 33B connected to the n-side wiring 34B. These two joining layers 33A and 33B are insulated from each other by the support substrate-side insulating layer 32. Note that the insulating layer 18 is sometimes referred to as a semiconductor layer-side insulating layer in the present embodiment.

Examples of the material of the support substrate 31 may include conductive materials such as Si and SiC. A material such as AuSn, for example, can be used as the material of the p-side joining layer 33A and the n-side joining layer 33B. Examples of the material of the insulating protection film 36 and the support substrate-side insulating layer 32 may include insulating materials such as $SiO_2$ and SiN. A metal such as Ti, Al, Pt, or Au, for example, can be used as the material of the n-electrode 35. Examples of the material of the p-side wiring 34A and the n-side wiring 34B may include metals such as Ti, Pt, and Au.

Figure 4A:
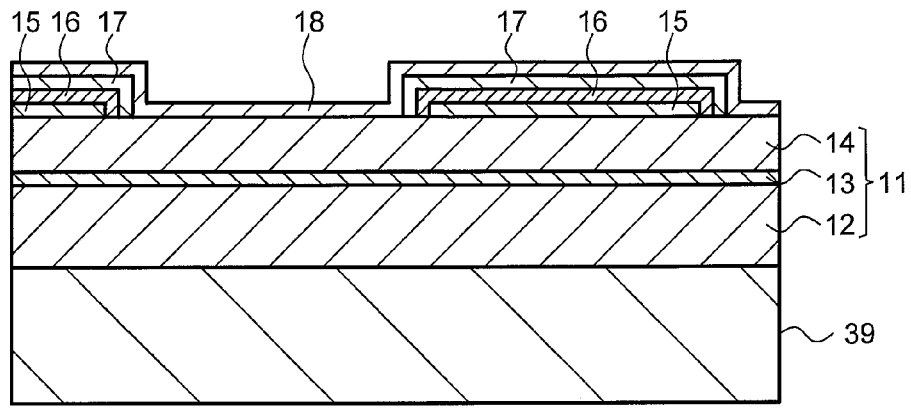
FIGS. 4A to 4C are cross-sectional views illustrating a manufacturing process of the semiconductor light-emitting element according to the second embodiment.

Next, with reference to FIGS. 4A to 4C, a method for manufacturing the semiconductor light-emitting element 30 will be described. First, as shown in FIG. 4A, the n-type semiconductor layer 12, the light-emitting layer 13, and the p-type semiconductor layer 14 are grown on a growth substrate 39 in order. In the present embodiment, a sapphire substrate with a crystal growth plane being a c-plane was used as the growth substrate 39. Moreover, a metal organic chemical vapor deposition method (MOCVD method) was employed for the growth of the semiconductor structure layer 11. Subsequently, the ohmic electrode layer 15 was formed on the p-type semiconductor layer 14. The reflective metal layer 16 was formed so as to cover the ohmic electrode layer 15. The covering electrode layer 17 was formed so as to bury the reflective metal layer 16. When forming the ohmic electrode layer 15, the reflective metal layer 16, and the covering electrode layer 17, a sputtering method was employed. When forming the reflective metal layer 16, a lift-off method was employed. Specifically, the shape of the ohmic electrode layer 15 was first patterned on the surface of the p-type semiconductor layer 14 by photolithography and then the ohmic electrode layer 15 was formed. Similarly by means of the patterning by photolithography and film formation by the sputtering method, the reflective metal layer 16 and the covering electrode layer 17 were formed. At this time, the surface of part of the p-type semiconductor layer 14 was exposed. Subsequently, the insulating layer (semiconductor layer-side insulating layer) 18 was formed so as to cover the exposed surface of the p-type semiconductor layer 14 and the covering electrode layer 17. When forming the insulating layer 18, the sputtering method was employed.

Figure 4B:
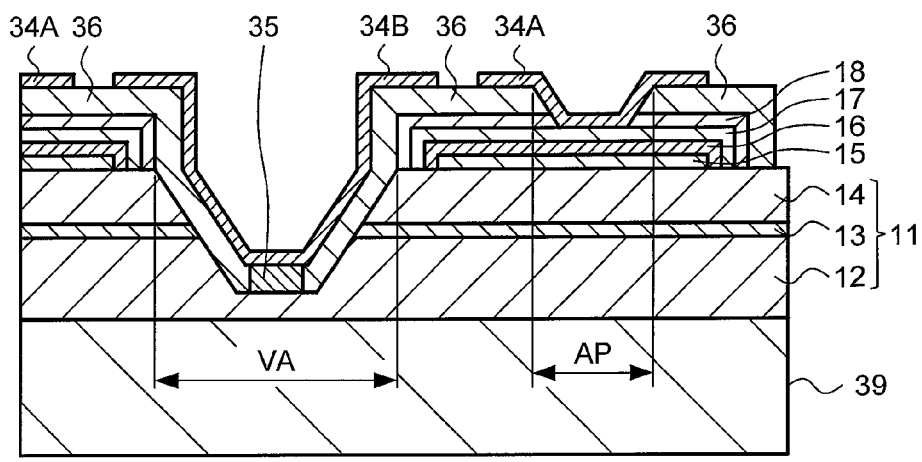

Next, as shown in FIG. 4B, a resist having an aperture is formed by the photolithography method in a region where the insulating layer 18 is directly formed on the p-type semiconductor layer 14 and etching was performed in that region. Consequently, the through hole VA extending from the p-type semiconductor layer 14 side into the n-type semiconductor layer 12 through the p-type semiconductor layer 14 and the light-emitting layer 13 was obtained. Subsequently, the insulating protection film 36 was formed on the whole of the inner surface of the through hole VA and the surface of the insulating layer 18. When forming the insulating protection film 36, the sputtering method was employed. Next, the insulating protection film 36 was removed in part of the through hole VA by etching. The n-electrode 35 was formed on the surface of the exposed n-type semiconductor layer 12. Subsequently, etching was performed on the insulating layer 18 and the insulating protection film 36 to form an aperture AP extending up to the covering electrode layer 17 through the insulating protection film 36 and the insulating layer 18. Thereafter, the p-side wiring 34A and the n-side wiring 34B connected to the covering electrode layer 17 and the n-electrode 35, respectively, were formed on the insulating protection film 36. When forming the p-side wiring 34A and the n-side wiring 34B, the sputtering method was employed. Note that the aperture AP may be formed so as to run through the covering electrode layer 17 to have a depth extended into the reflective metal layer 16. In such a case, the p-side wiring 34A is directly in contact with the reflective metal layer 16.

Figure 4C:
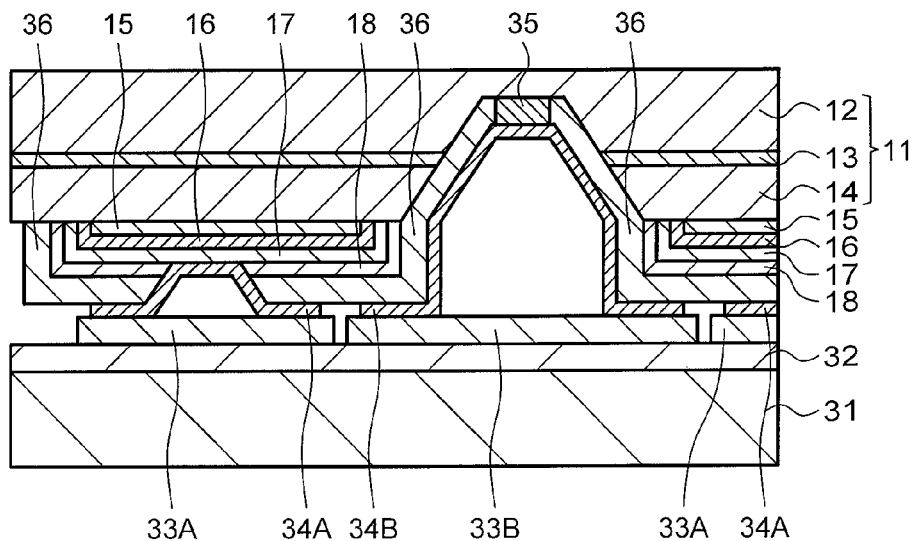

Subsequently, as shown in FIG. 4C, after the support substrate 31 was prepared and the support substrate-side insulating layer 32 was formed on the support substrate 31, the p-side joining layer 33A and the n-side joining layer 33B were formed. Thereafter, the semiconductor structure layer 11 was joined with the support substrate 31 via the p-side wiring 34A and the p-side joining layer 33A, and the n-side wiring 34B and the n-side joining layer 33B. This joining was made by thermocompression. Subsequently, the support substrate 31 was subjected to a polishing process to be thinned and the growth substrate 39 was removed by a laser lift-off technique. Thereafter, etching was performed on the exposed surface of the n-type semiconductor layer 12 so as to form a concavo-convex structure. Then, the support substrate was divided by dicing or the like to obtain the semiconductor light-emitting element 30.

In the present embodiment, the semiconductor structure layer 11 has the through hole (via) and the covering electrode layer 17 and the n-electrode 35 are formed on the same surface side of the semiconductor structure layer 11, i.e., the p-type semiconductor layer 14 side. When a semiconductor light-emitting element has such a via structure, the migration of Ag used as the material of the reflective metal layer 16 becomes especially problematic. Specifically, in view of its reflection efficiency, i.e., its light extraction efficiency, it is preferable that the reflective metal layer 16 be formed as wide as possible. On the other hand, the reflective metal layer 16 may be structurally very close to the n-electrode 35 and the n-side wiring 34B connected to the n-electrode 35. Specifically, when the element is seen from the above, the reflective metal layer 16 and the n-side wiring 34B may be formed in an overlapping manner. Therefore, it is required that the reflective metal layer 16 is reliably covered, i.e., the reflective metal layer 16 is reliably insulated from the n-electrode 35 and the n-side wiring 34B.

The characteristic of the present invention capable of reliably covering the reflective metal layer 16 containing Ag is especially effective in the present embodiment. More specifically, in the light-emitting element having the structure as in the present embodiment in which both of the n-side electrode and the p-side electrode are formed on the same surface side, the number of defectives can be dramatically reduced as compared with the conventional techniques. Moreover, this makes it possible to form the light reflection region more widely, thereby improving the light extraction efficiency. Therefore, the semiconductor light-emitting element having high reliability and improved light extraction efficiency can be provided.

As described above, according to the present invention, the ohmic electrode layer is formed on the semiconductor structure layer, the reflective metal layer is formed so as to cover at least the ends of the ohmic electrode layer, and the covering electrode layer is formed so as to bury the reflective metal layer. Thus, the migration of Ag contained in the reflective metal layer can be suppressed and the semiconductor light-emitting element with high reliability can be therefore provided.

While the case where the first semiconductor layer and the second semiconductor layer are an n-type semiconductor layer and a p-type semiconductor layer, respectively, has been described in the aforementioned embodiments, conductivity types of the first and second semiconductor layers are not limited thereto. The first and second semiconductor layers may have conductivity types opposite to those in the aforementioned embodiments.

This application is based on a Japanese Patent application No. 2013-196723 which is hereby incorporated by reference.

What is claimed is:

1. A semiconductor light-emitting element comprising:
   an ohmic electrode layer formed on a surface of a semiconductor structure layer including a light-emitting layer;
   a reflective metal layer containing Ag formed so as to cover at least ends of the ohmic electrode layer; and
   a covering electrode layer formed so as to bury the reflective metal layer,
   wherein the covering electrode layer is made of an oxide film having a conductive property, and
   wherein the ohmic electrode layer is made of an oxide film having light-transmitting and conductive properties.

2. The semiconductor light-emitting element according to claim 1, wherein the covering electrode layer includes a first covering electrode layer formed so as to bury the reflective metal layer and a second covering electrode layer formed so as to cover the first covering electrode layer, and
   wherein an oxygen concentration of the first covering electrode layer is smaller than an oxygen concentration of the second covering electrode layer.

3. The semiconductor light-emitting element according to claim 1, further comprising an insulating layer formed so as to cover the covering electrode layer.

4. A semiconductor light-emitting element comprising:
   an ohmic electrode layer formed on a surface of a semiconductor structure layer including a light-emitting layer;
   a reflective metal layer containing Ag formed so as to cover at least ends of the ohmic electrode layer;
   a covering electrode layer formed so as to bury the reflective metal layer; and
   an insulating layer formed so as to cover the covering electrode layer;
   wherein the semiconductor structure layer has a structure in which a p-type semiconductor layer and an n-type semiconductor layer are provided so as to interpose the light-emitting layer therebetween, and a surface of the semiconductor structure layer is a surface of the p-type semiconductor layer, and wherein the semiconductor light-emitting element further comprises:
- an insulating protection film formed so as to cover the insulating layer and an inner surface of a through hole extending from the p-type semiconductor layer side into the n-type semiconductor layer through the p-type semiconductor layer and the light-emitting layer;
- an n-electrode provided in the through hole and connected to the n-type semiconductor layer through the insulating protection film;
- a p-side wiring connected to the covering electrode layer through the insulating protection film; and
- an n-side wiring connected to the n-electrode.

5. A semiconductor light-emitting element comprising:
- an ohmic electrode layer formed on a surface of a semiconductor structure layer including a light-emitting layer;
- a reflective metal layer containing Ag formed so as to cover at least ends of the ohmic electrode layer; and
- a covering electrode layer formed so as to bury the reflective metal layer;
- wherein each of the ohmic electrode layer and the covering electrode layer is made of an ITO layer.

6. The semiconductor light-emitting element according to claim 1, wherein a sheet resistance of the covering electrode layer is smaller than a sheet resistance of the ohmic electrode layer.

* * * * *